US007308043B1

(12) United States Patent
Frank

(10) Patent No.: US 7,308,043 B1
(45) Date of Patent: Dec. 11, 2007

(54) SCRAMBLED CHIRP FREQUENCY JITTER FOR FEATURE SUPPRESSION

(75) Inventor: Robert J. Frank, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 701 days.

(21) Appl. No.: 10/668,024

(22) Filed: Sep. 22, 2003

(51) Int. Cl.
*H03K 7/06* (2006.01)

(52) U.S. Cl. ...................... 375/303; 375/132; 375/139; 342/132

(58) Field of Classification Search ................ 375/130, 375/132, 138, 139, 140, 141, 146, 295, 302, 375/303; 342/118, 128, 130, 131, 132
See application file for complete search history.

(56) References Cited

U.S. PATENT DOCUMENTS 4,309,703 A * 1/1982 Blahut ........................ 342/201
4,677,617 A * 6/1987 O'Connor et al. .......... 370/478
5,084,901 A * 1/1992 Nagazumi .................... 375/139
6,047,018 A * 4/2000 Emi ........................... 375/135
6,434,184 B2 * 8/2002 Lindsey ...................... 375/135
6,865,216 B1 * 3/2005 Beamish et al ............. 375/140
2006/0239334 A1 * 10/2006 Kwon et al. ................ 375/132

* cited by examiner

*Primary Examiner*—Chieh M. Fan
*Assistant Examiner*—Naheed Ejaz
(74) *Attorney, Agent, or Firm*—Nathan O. Jensen; Kyle Eppele

(57) ABSTRACT

A method of minimizing detectability of an electronically communicated message is disclosed. A predetermined frequency modulation pattern about a nominal transmission frequency is defined. The predetermined frequency modulation pattern is suitable to vary the nominal transmission frequency during a dwell period. The dwell period is divided into a plurality of sub-dwell periods. Each sub-dwell period has a nominal sub-frequency assigned thereto according to the predetermined frequency modulation pattern. The plurality of sub-dwell periods and the respective assigned nominal sub-frequencies are randomly or pseudo-randomly ordered. The message is transmitted according to the random or pseudo-random ordering of the nominal sub-frequencies.

14 Claims, 13 Drawing Sheets

SCRAMBLED CHIRP FREQUENCY JITTER FOR FEATURE SUPPRESSION

FIELD OF THE INVENTION

The invention relates to communications, and more particularly, to a system and method for providing a secure means of communication.

BACKGROUND OF THE INVENTION

There are many situations in which it is desired to prevent the unintended reception and monitoring of electronic communication. For instance, the value or relevance of certain business, personal, or national defense-related data may be diminished if not maintained in confidence. Various schemes have been developed to reduce the likelihood of unintended reception of such data. One such scheme is known as frequency hopping, an example of which is shown in FIG. 9. According to the frequency hopping algorithm shown therein at reference number 100, a message is divided into a plurality of portions 102 that are transmitted according to a predetermined sequence of frequencies. Each portion 102 is transmitted for a predetermined duration, which is known as a dwell time 104. Unless a receiver knows the predetermined frequency sequence, it may be difficult to obtain enough of the message portions to reconstruct the entire message.

Notwithstanding this difficulty, certain strategies have been developed to identify the frequencies upon which the message is being transmitted. For example, when using the commonly-employed Minimum Shift Keying (MSK) or Gaussian Minimum Shift Keying (GMSK) communication techniques, useful information may be obtained by putting the received signal through a non-linear operation such as a squaring or cubing operation. FIG. 10 depicts a power spectral density (PSD) plot showing the power spectral density of a squared GMSK signal as a function of the ratio of frequency to data rate. Strong harmonics 105, 106, 107 can be seen at half the data rate, 1.5 times the data rate, and 2.5 times the data rate, respectively. An intercept receiver may be programmed to detect and identify strong harmonics, and the original signal may be derived therefrom.

A further level of protection may be realized by varying the transmit frequency while the frequency hopping algorithm dwells on a frequency. This frequency variance is known as "jitter," and the frequency deviation of the jitter is typically much smaller than the magnitude of frequency change imparted by the frequency hopping algorithm. While many jitter algorithms exist, a preferred algorithm is depicted in FIG. 11 at reference number 110, in which the frequency of each portion 112 gradually increases through a nominal frequency fn throughout the respective dwell time 114. This type of frequency increase is known as a frequency "chirp" because of its resemblance to the increasing frequency of the sound of a bird's chirp. The uniform and compact frequency distribution of the frequency chirp technique, shown in the histogram of FIG. 12, makes the frequency chirp technique preferable over other types of jitter algorithms.

The frequency chirp technique also reduces the detectability of second order harmonics when used with a GMSK signal. FIG. 13 is a PSD diagram of a squared GMSK signal using the frequency chirp technique. The various output lines 116, 118, 120 represent different windowing techniques (such as Blackman Harris, Boxcar, Hanning, and Bartlett) available to an intercept receiver to analyze the phase shift of an incoming signal. Note that the narrowest harmonic, at 115, illustrates the original harmonic content before the frequency chirp technique was applied. It can be seen that using the frequency chirp technique somewhat reduces the detectable magnitude of the second-order harmonics, and arbitrarily good harmonic suppression can be realized depending on the magnitude of the frequency deviation chosen by the chirp. Indeed, the frequency chirp technique may be advantageously used purposes of harmonic suppression. Unfortunately, it is possible for an intercept receiver to be configured to compensate for a frequency chirp, and merely remove the frequency variations of the chirp prior to processing the signal.

It is therefore an object of the invention to reduce the detectability of an electronically transmitted signal.

It is another object of the invention to increase the security of a GMSK signal transmission by reducing the detectability of one or more second-order harmonics.

It is a further object of the invention to reduce the detectability of a signal while maintaining an acceptable level of signal strength.

A feature of the invention is the division of a frequency chirp into a plurality of scrambled transmission periods, where the frequency during each transmission period is either increasing or decreasing.

An advantage of the invention is a reduced ability of an unauthorized receiver to detect a transmitted signal.

SUMMARY OF THE INVENTION

The invention provides a method of minimizing detectability of an electronically communicated message. According to the method, a nominal transmission frequency is established. A predetermined frequency modulation pattern about the nominal transmission frequency is defined. The predetermined frequency modulation pattern is suitable to vary the nominal transmission frequency during a dwell period. The dwell period is divided into a plurality of sub-dwell periods. Each sub-dwell period has a nominal sub-frequency assigned thereto according to the predetermined frequency modulation pattern. The plurality of sub-dwell periods and the respective assigned nominal sub-frequencies are randomly ordered. The message is transmitted according to the random ordering of the nominal sub-frequencies.

The invention also provides a method of minimizing detectability of a message transmitted by a frequency hopping algorithm. According to the method, a nominal frequency is established which is suitable for transmitting the message during a dwell period according to the frequency hopping algorithm. A predetermined frequency modulation pattern about the nominal frequency is defined. The predetermined frequency modulation pattern is suitable to vary the nominal frequency during the dwell period. The dwell period is divided into a plurality of sub-dwell periods, where each sub-dwell period has a nominal sub-frequency assigned thereto according to the predetermined frequency modulation pattern. The sequence of the plurality of sub-dwell periods and the respective assigned nominal sub-frequencies during the dwell period are re-arranged. For each rearranged nominal sub-frequency, the nominal sub-frequency during the respective sub-dwell period is varied by one of increasing and decreasing the nominal sub-frequency. The message is transmitted at frequencies by which each rearranged nominal sub-frequency has been increased or decreased.

The invention further provides a method of electronically transmitting a message. According to the method, a nominal transmission frequency is established. A predetermined frequency modulation pattern about the nominal transmission frequency is defined. The predetermined frequency modulation pattern is suitable to vary the nominal transmission frequency during a dwell period. The dwell period is divided into a plurality of sub-dwell periods. Each sub-dwell period has a nominal sub-frequency assigned thereto according to the predetermined frequency modulation pattern. The sequence of the plurality of sub-dwell periods and the respective assigned nominal sub-frequencies are rearranged according to a pseudo-random algorithm. The message is transmitted according to the rearranged ordering of the nominal sub-frequencies.

DETAILED DESCRIPTION OF THE DRAWINGS

Figure 11:
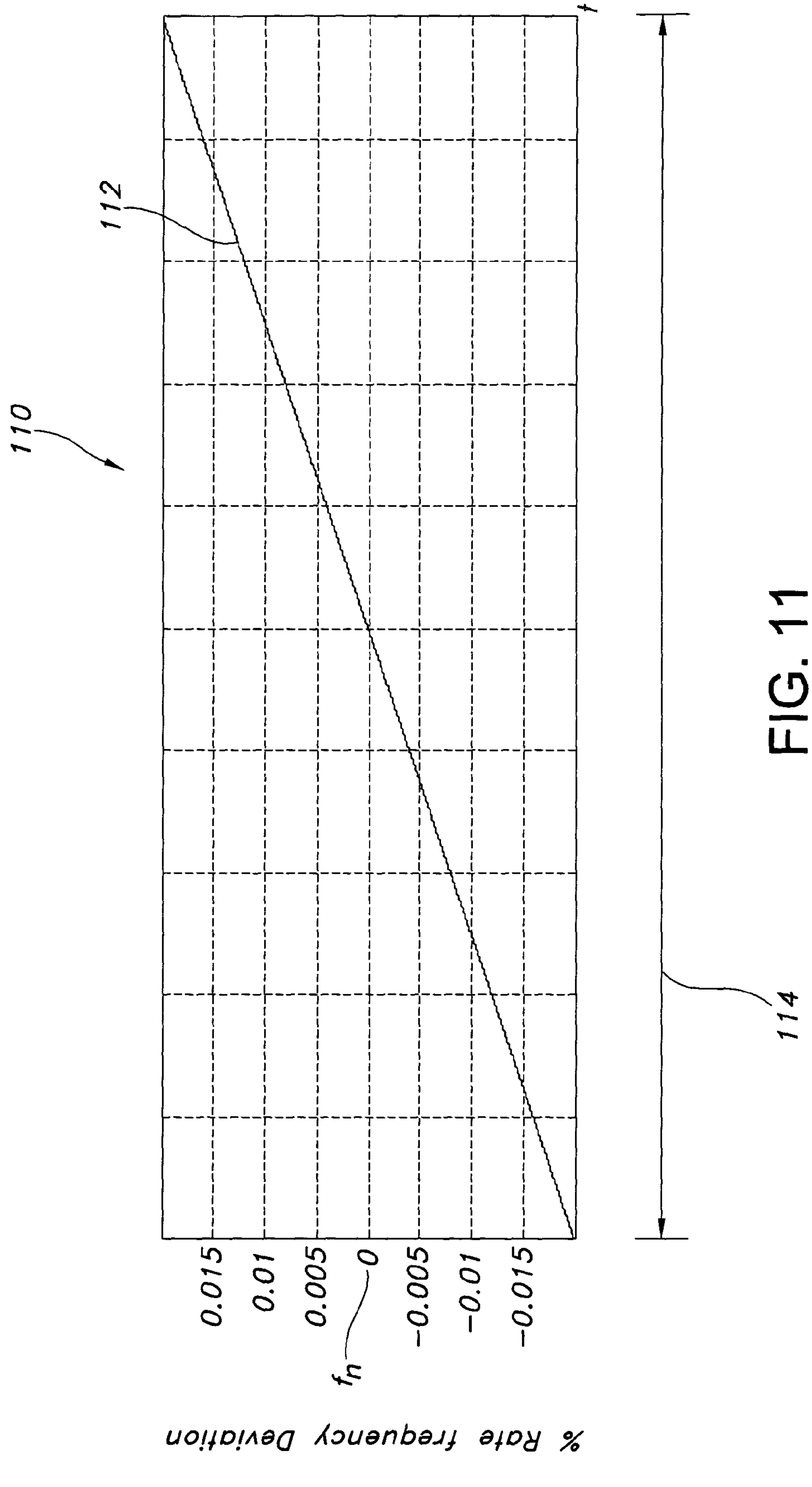
FIG. 11 (PRIOR ART)
FIG. 11 is a graph showing a portion of a frequency hopping algorithm that incorporates frequency chirping.
Figure 12:
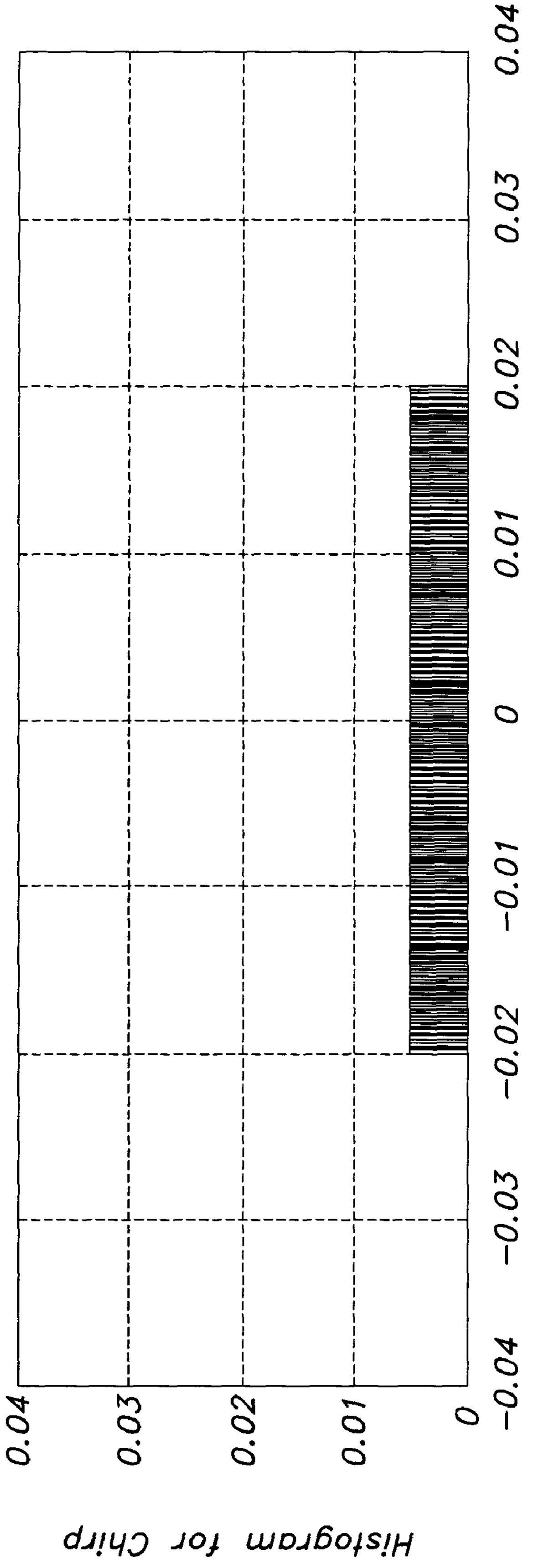
FIG. 12 is a histogram showing expected frequency distribution of the algorithm shown in FIG. 11.

FIG. 11 is a graph showing a constant increase of frequency during a generic transmission period, which may be the time a frequency hopping algorithm is dwelling on one of a plurality of predetermined hops. As previously explained, the depicted constant frequency increase is known as a "chirp" because of its resemblance to the increasing or decreasing frequency of a bird call. Because of the flat spectral density of the frequency chirp, as shown in the histogram of FIG. 12, the deterministic frequency chirp is a preferred method of varying the frequency during frequency hop dwell times. However, because of its deterministic nature, an intercept receiver may be programmed to compensate for such a predictable frequency modulation pattern and intercept the communication.

Figure 1:
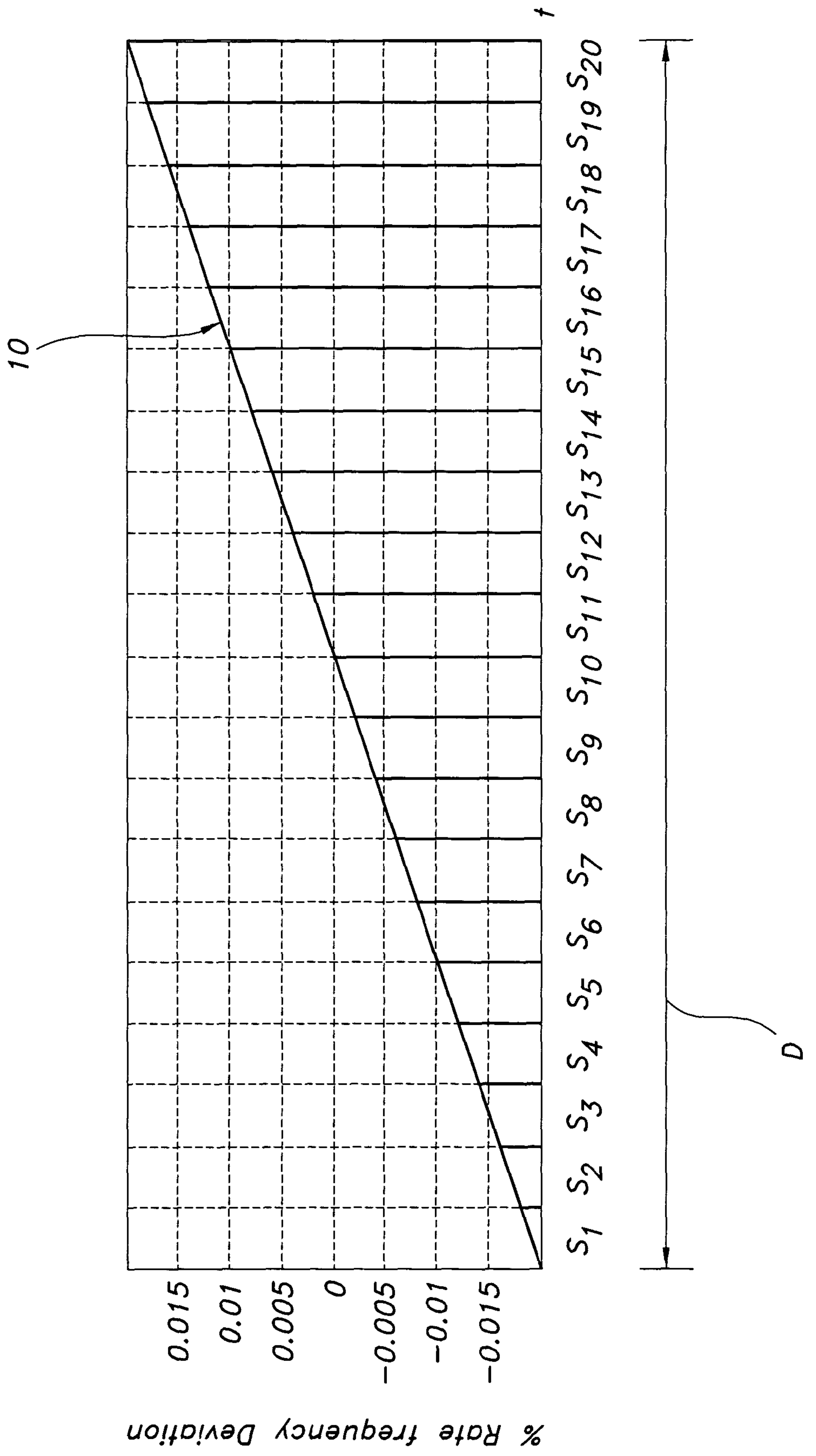
FIG. 1 is a graph showing a frequency chirp divided into sub-dwell periods according to an embodiment of the invention.
Figure 2:
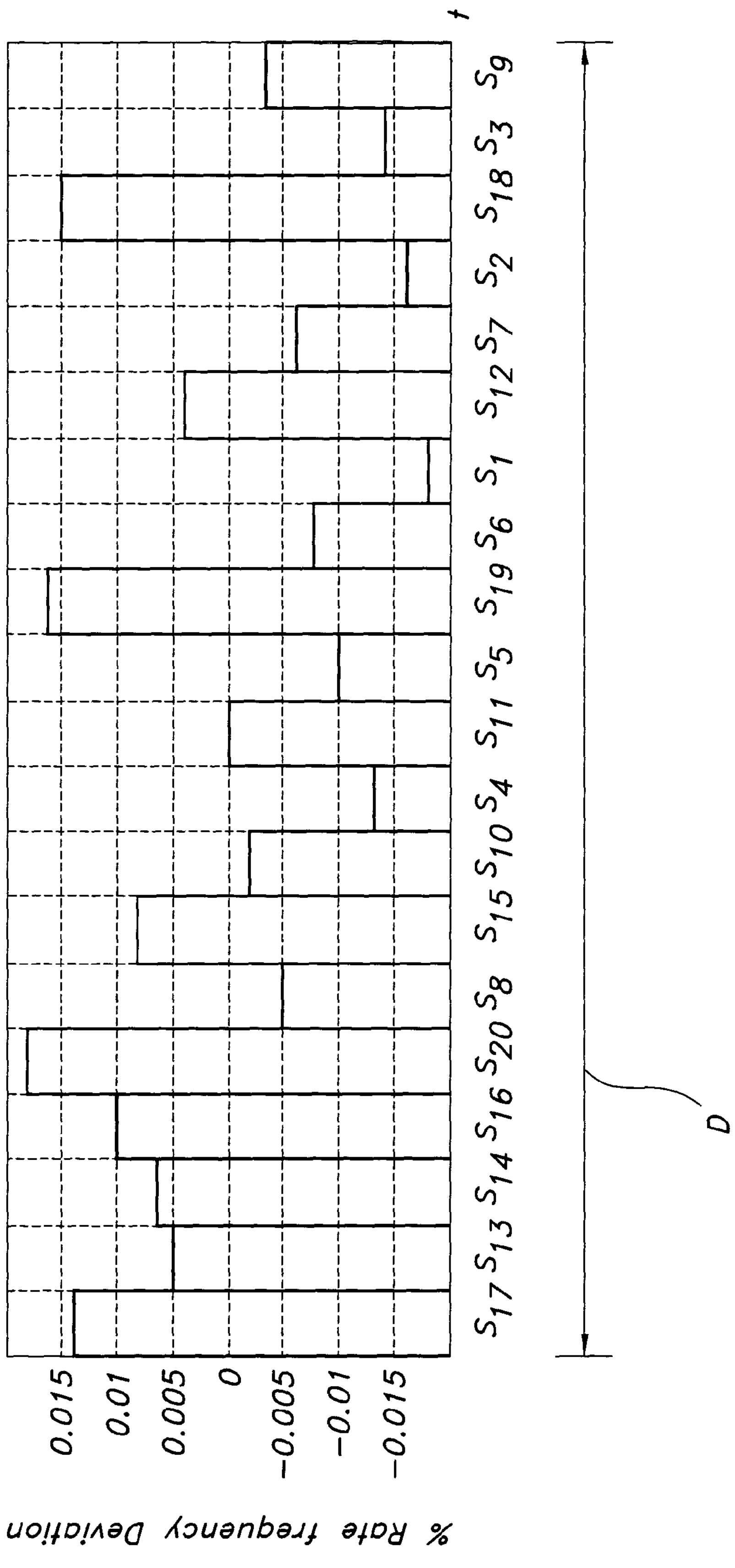
FIG. 2 is a graph showing a scrambled frequency chirp according to another embodiment of the invention.

To increase the difficulty of intercepting the communication while maintaining a predictable spectral density, the frequency chirp is subdivided into portions and placed in random order. As shown in FIG. 1, the dwell period or duration D of a frequency chirp 10 is divided into a plurality of sub-dwell periods s1-s20. In the depicted embodiment the sub-dwell periods are equal in length. In FIG. 2, the sub-dwell periods are randomly ordered, or scrambled. The scrambling is done in an order known only to authorized transmitters and receivers, such as those having access to a TRANSEC-type encryption key which employs a pseudo-random noise (PRN) generator. The scrambling of the sub-dwell periods is preferably performed differently for each frequency chirp. For example, in FIG. 2 the order of occurrence of the sub-dwell periods during duration D is s17, s13, s14, s16, s20, s8, s15, s10, s4, s11, s5, s19, s6, s1, s12, s7, s2, s18, s3, and s9. The sub-dwell periods may be scrambled in different sequences or orders in other durations.

Figure 3:
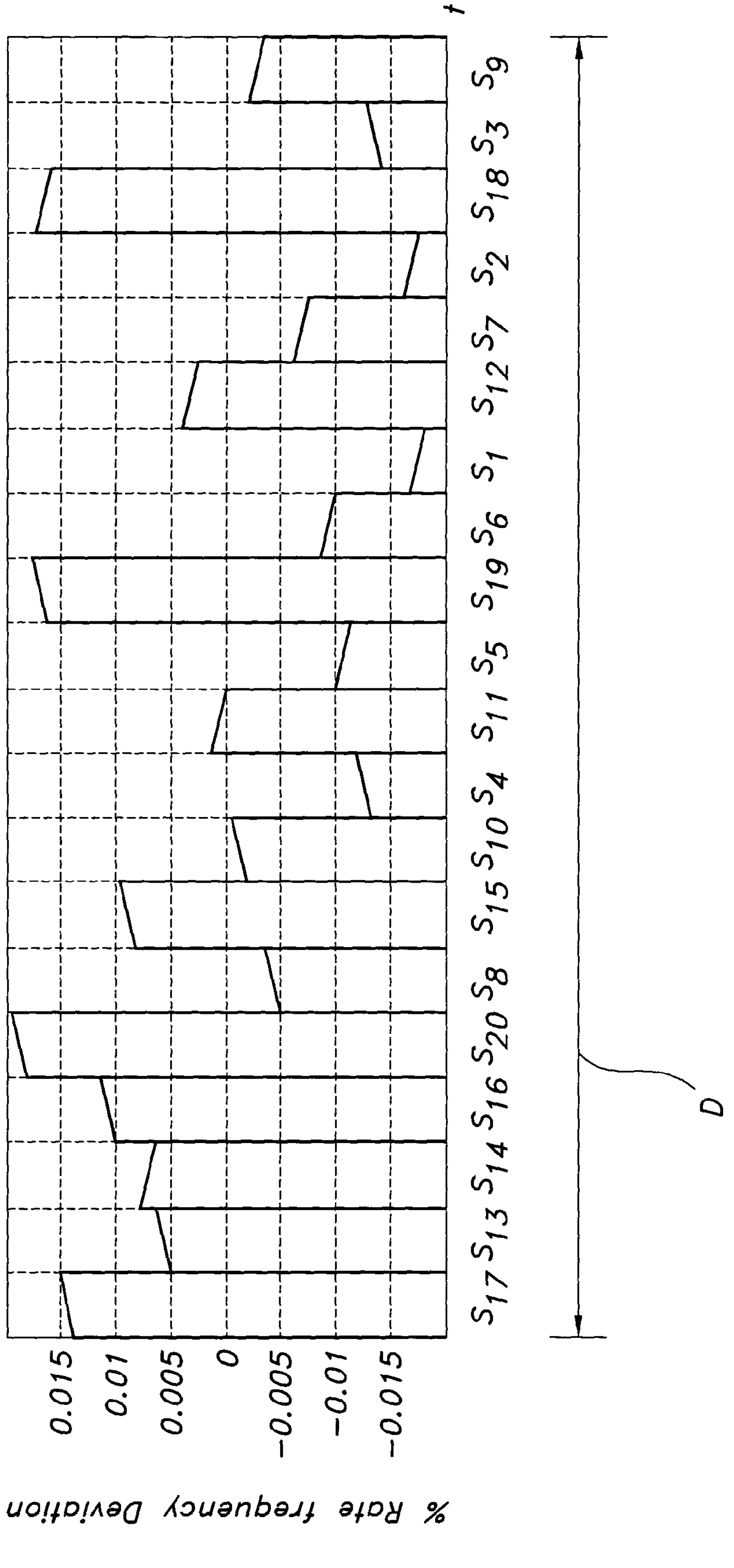
FIG. 3 is a graph showing further modifications to the scrambled frequency chirp according to the invention.

The scrambled chirp is further modified by either increasing or decreasing the frequency for the duration of each sub-dwell period. As shown in FIG. 3, for example, the frequency is decreased during sub-dwell periods s14, s11, s5, s6, s1, s12, s7, s2, s18, and s9, while the frequency is increased during sub-dwell periods s13, s16, s20, s8, s15, s10, s4, s19, and s3. The decision of whether to increase or decrease the frequency during each sub-dwell period is preferably completely random and may be done so at the instruction of a PRN-generator in an encryption key. It may be helpful to select a representative frequency within each sub-dwell period, such as the frequency at the beginning, end, or a midpoint of the sub-dwell period, from which to increase or decrease the frequency during said sub-dwell period.

Figure 4:
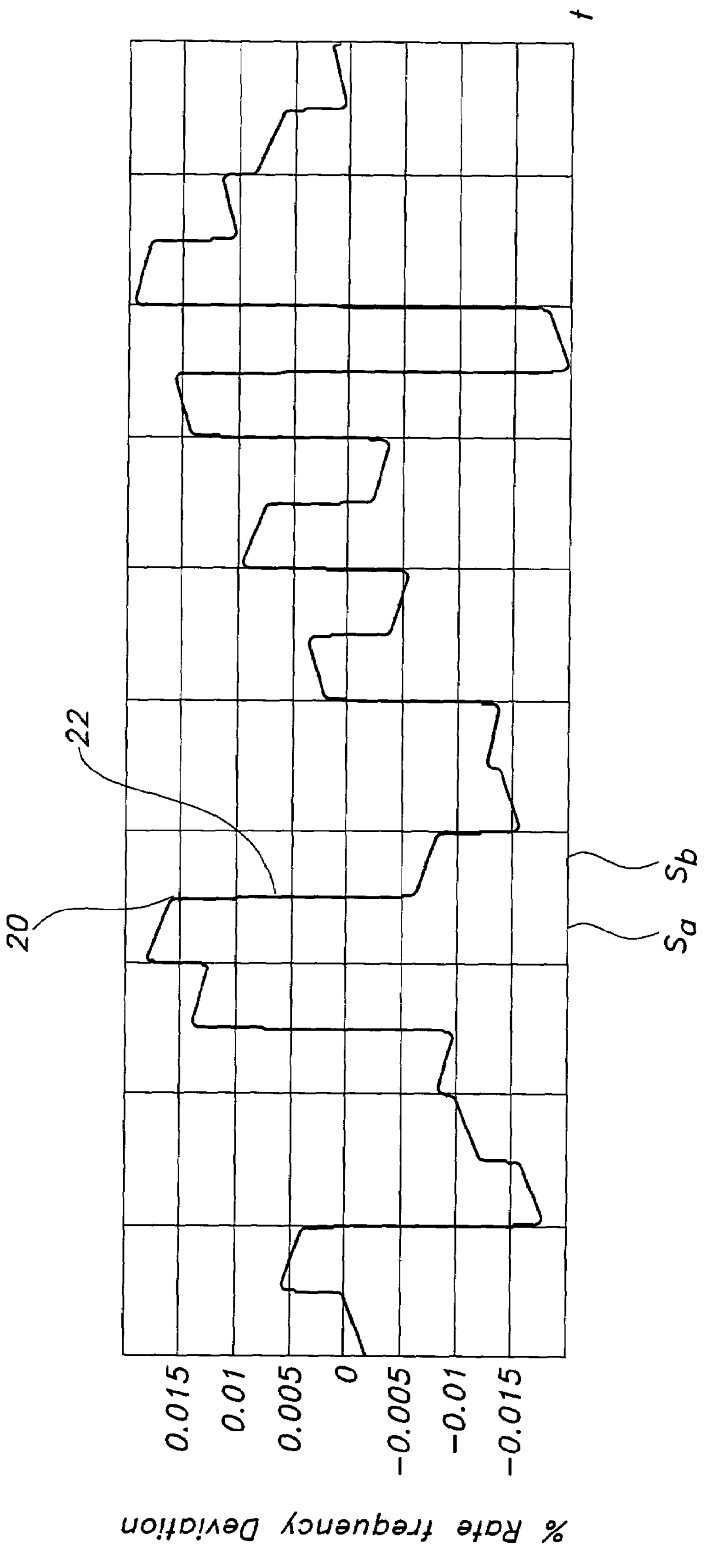
FIG. 4 is a graph of a filtered, scrambled frequency chirp according to the invention.

It can be seen in FIG. 3 that the transition between successive sub-dwell periods may be rather extreme. To smooth the transition between frequency changes during successive sub-dwell periods, the scrambled chirp may be further modified by employing a band-limiting filtering technique such as Gaussian filtering. This is shown in FIG. 4, for example between adjacent sub-dwell periods sa and sb. The smoothed corner at 20 and the slightly non-vertical line 22 represent an extension of time in which to transition from frequencies associated with sub-dwell period sa to frequencies associated with sub-dwell period sb. The band-limiting filter removes the sharp discontinuities in the phase trajectory rate of the signal, said discontinuities possibly creating significant high frequency content. Eliminating the potential high frequency content by filtering the signal limits the bandwidth of the signal to boundaries more closely approximating the frequency distribution of an unscrambled signal.

Figure 5:
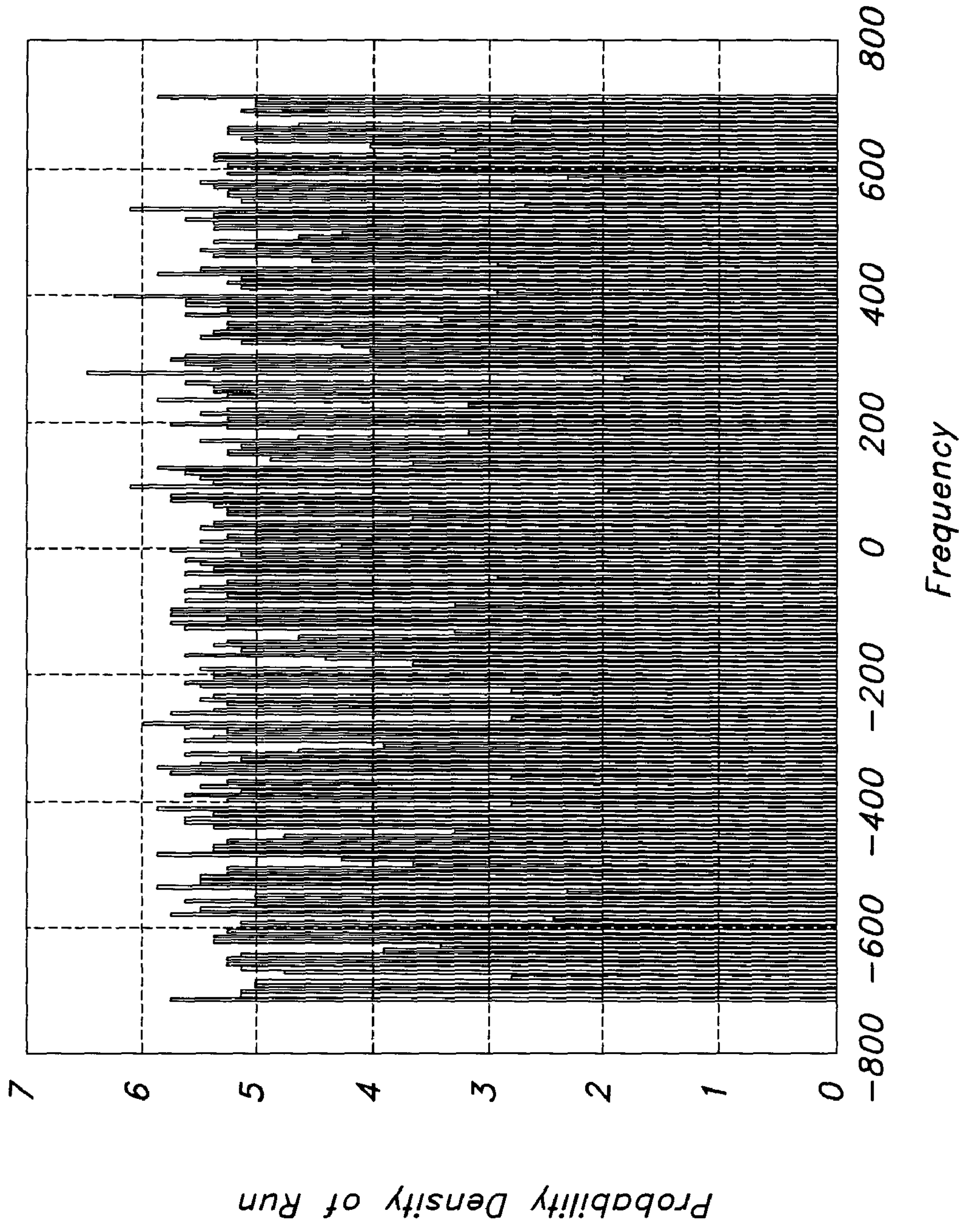
FIG. 5 is a histogram of a filtered, scrambled frequency chirp according to the invention.

FIG. 5 is a histogram of the frequencies covered by the scrambled, filtered chirp of FIG. 4. This illustrates the flat spectral distribution, along with the low variation and absolute frequency containment of the method. In fact, FIG. 5 possesses similar characteristics to FIG. 12, which is a histogram for an unscrambled frequency chirp. Other known jittering techniques, such as random jitter or randomly "walking" jitter, in which the frequency randomly increases or decreases in relation to the immediately-preceding frequency during the dwell period, exhibit spectral densities that are either less compact, less repeatable, or show less uniform distribution for each duration, because of the inherent lack of determinism of the techniques. The invented scrambled frequency chirp, in contrast, maintains compact and flat spectral density while providing a randomness characteristic decipherable only to an authorized receiver.

Figure 6:
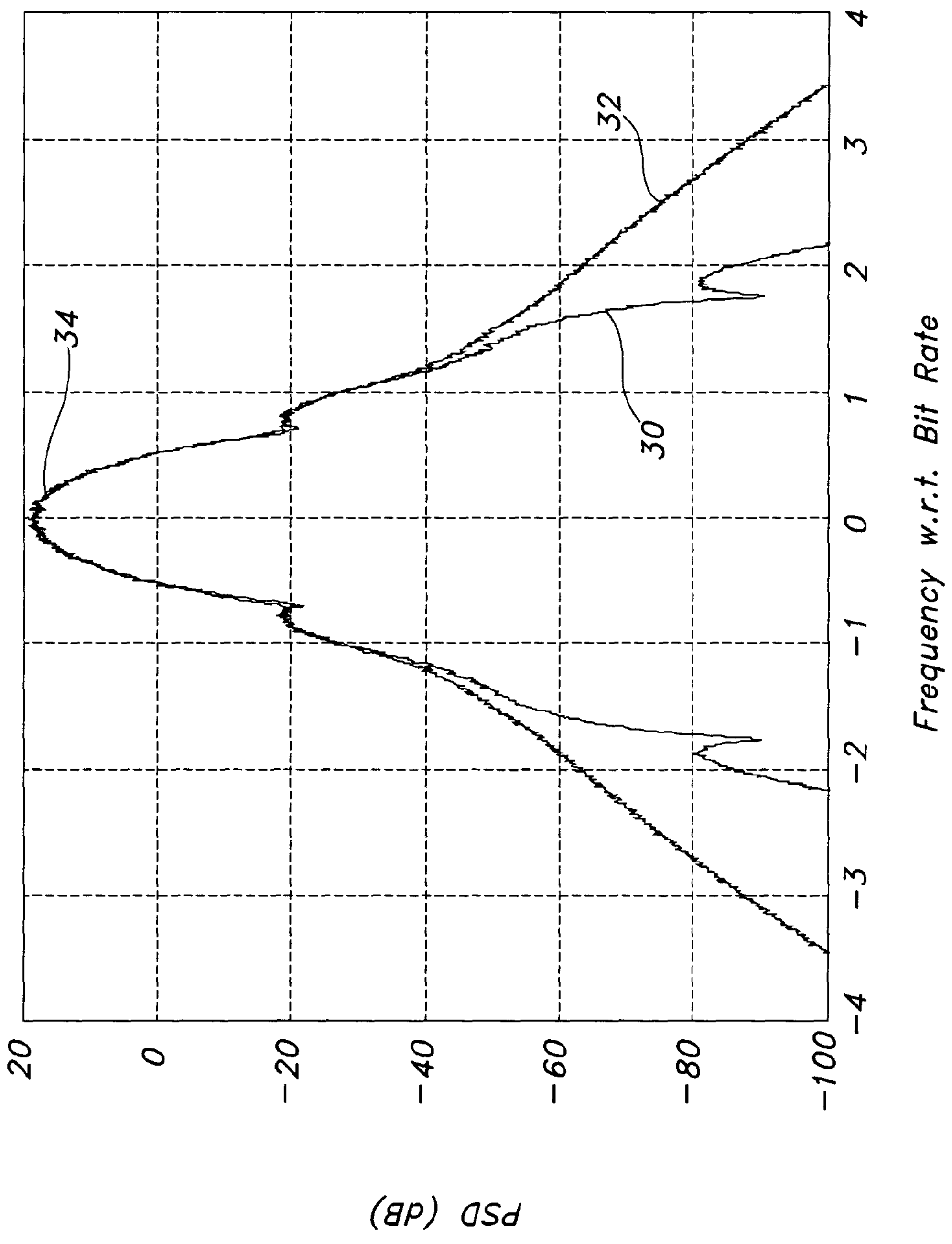
FIG. 6 is a power spectral density plot showing spectral containment achievable using the invention.

The invention may advantageously used with Gaussian Minimum Shift Keying (GMSK). FIG. 6 is a power spectral density (PSD) plot showing the spectral containment achievable with 9% double-sided maximum frequency deviation in conjunction with Gaussian filtering of the scrambled frequency chirp of the present invention. The Figure plots spectral containment for an unmodified GMSK signal 30 compared to a GMSK signal 32 using the invention. The spectral shape of the two signals 30, 32 are substantially similar out to −60 dB with respect to the peak power spectral density 34. The band-limiting filtering, as explained with respect to FIG. 4 above, assists in maintaining similar a spectral shape by removing high frequency components from the signal due to discontinuities between sub-dwell periods. Known frequency jitter techniques typically do not show similar spectral containment to the invented method.

Figure 7:
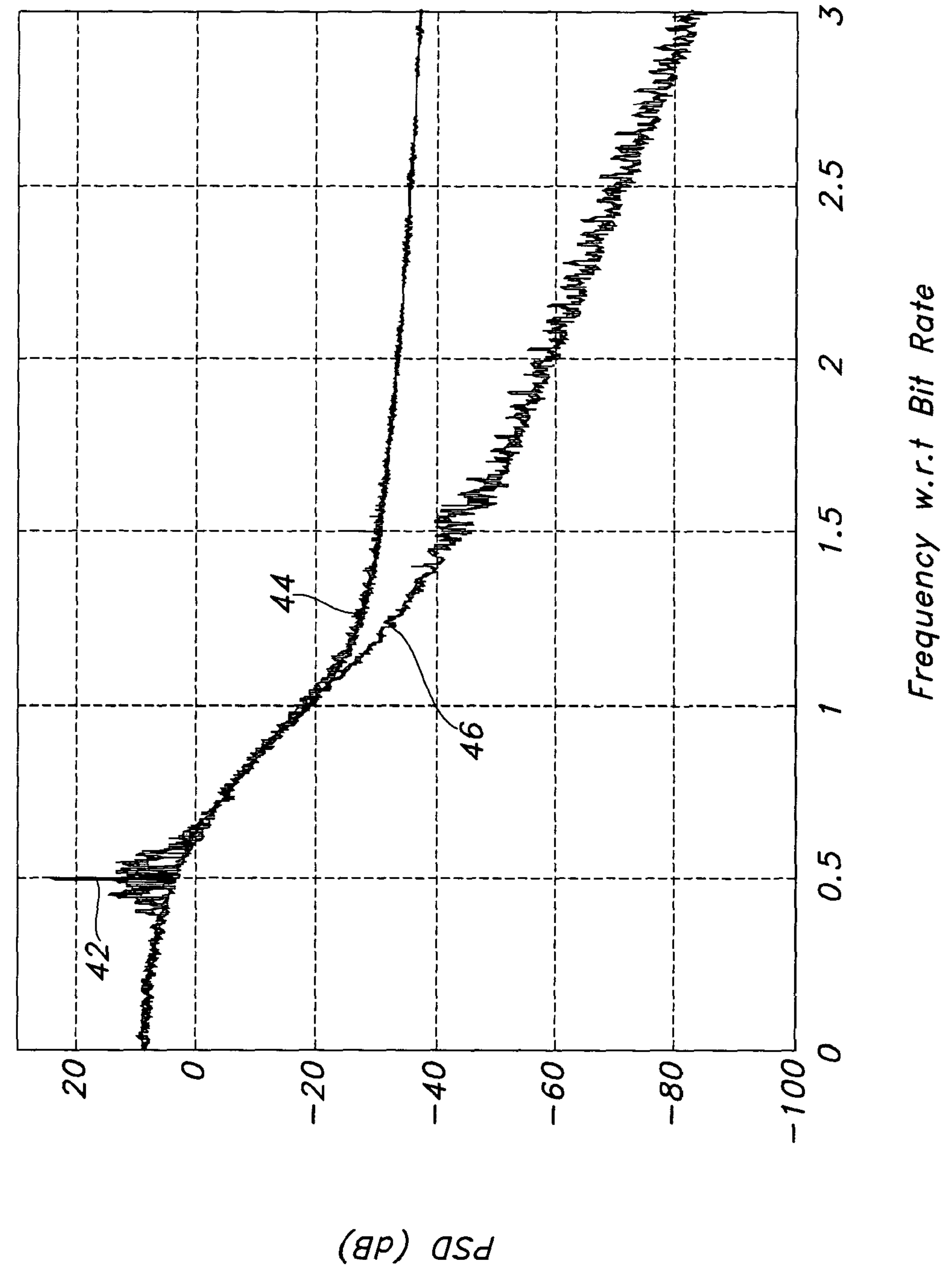
FIG. 7 is a power spectral density diagram of a complex squared GMSK signal with a filtered scrambled frequency chirp according to the invention.
Figure 10:
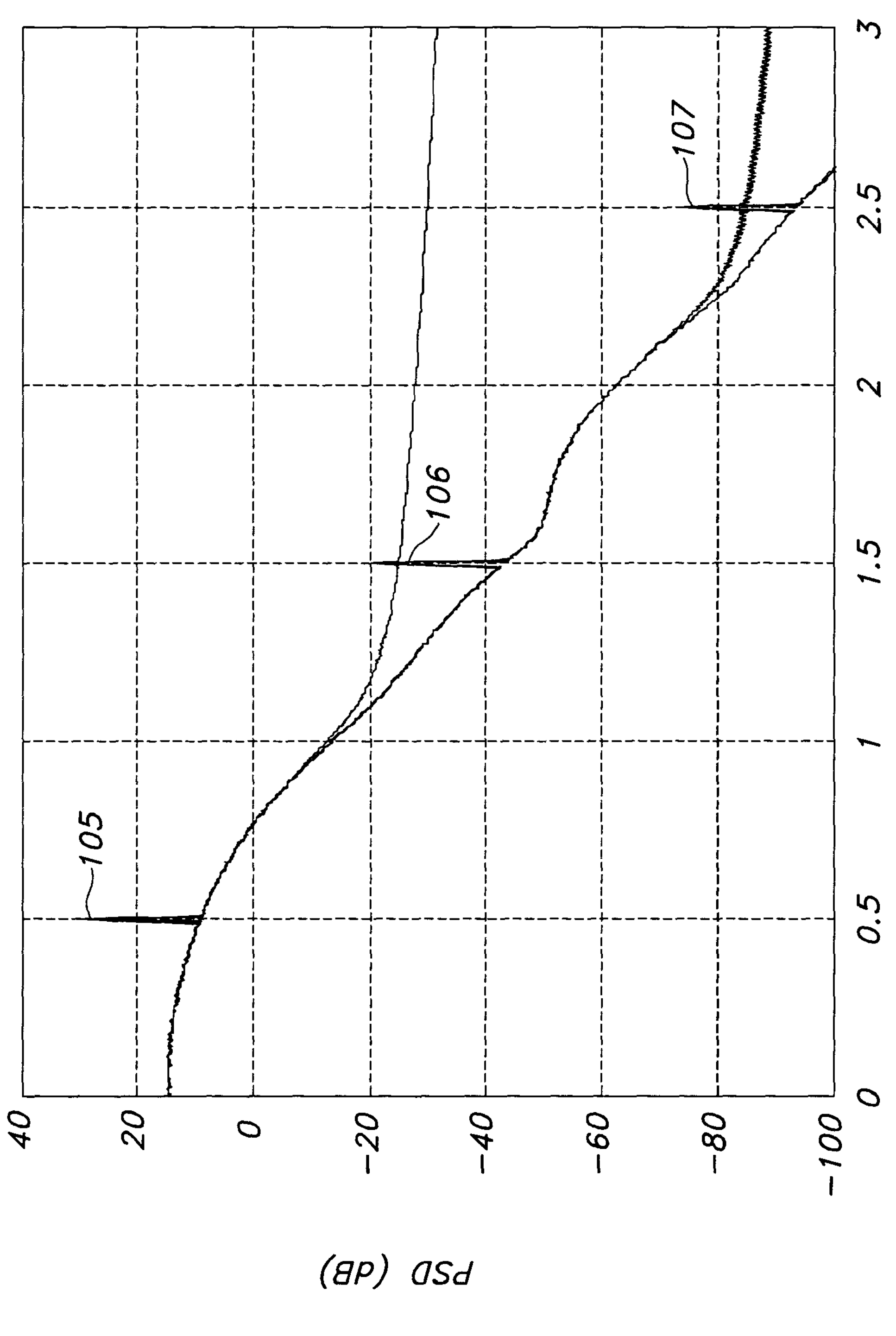
FIG. 10 is a power spectral density diagram of a complex squared GMSK signal that may use the basic frequency hopping algorithm of FIG. 9.
Figure 13:
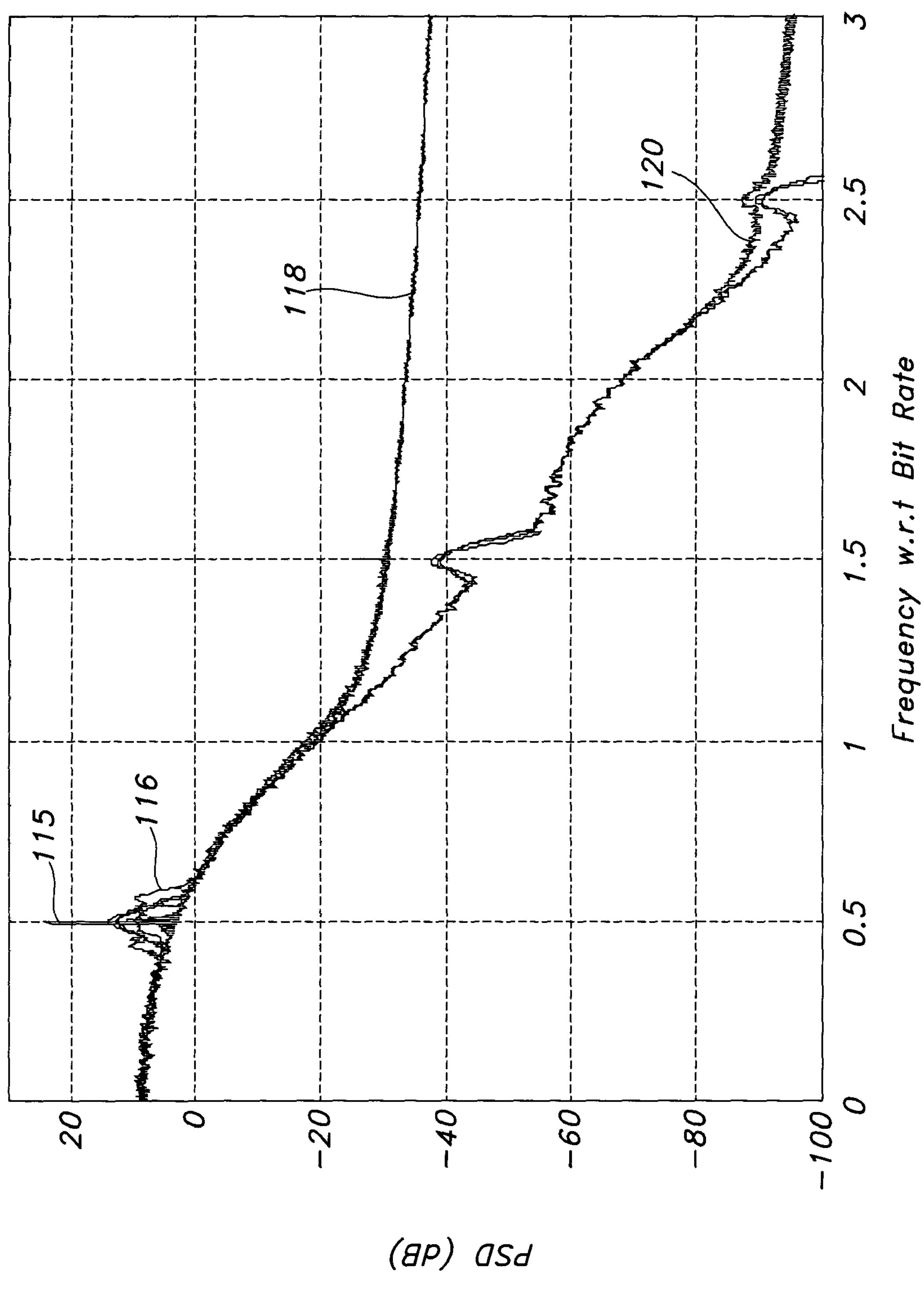
FIG. 13 is a power spectral density diagram of a complex squared GMSK signal that has incorporated non-scrambled frequency chirping therein.

FIG. 7 shows a PSD plot of complex squared GMSK signal using the filtered, scrambled frequency chirp of the invention. While the original signal exhibits an easily detectable harmonic 42, the windowing techniques available to an intercept receiver and shown at 44 and 46 contain virtually no harmonic "spikes" that may be used to identify the transmitting frequency. When compared with similar PSD plots for an unmodified GMSK signal (FIG. 10) and an unscrambled frequency chirp (FIG. 13), it is seen that the invented filtered scrambled frequency chirp method provides superior protection from frequency detection.

The invention may be varied in many ways. For example, the number of sub-dwell periods (FIG. 1) may be varied. Sub-dwell periods of different lengths may be employed within a single dwell period or duration. The increasing or decreasing of frequency during a sub-dwell period (FIG. 3) may additionally or alternatively include linear, logarithmic, sinusoidal, exponential, sawtooth, or random increasing or decreasing characteristics and may have varying slopes and/or rates of frequency change. A frequency "chirp" is not the only deterministic frequency modulation scheme that may be randomly scrambled using methods of the invention. Other frequency modulation schemes, such as a gradual decrease of frequency during a duration or dwell time, may also be used with the invention. Lastly, although the filtered, scrambled frequency chirp method of the invention may be advantageously used with frequency hopping systems, non-hopping transmission systems could potentially take advantage of the invented method as well. The invention may be used to reduce harmonic content in Ultra-Wideband systems, or in any other system where it is desired to suppress harmonic content.

Figure 8:
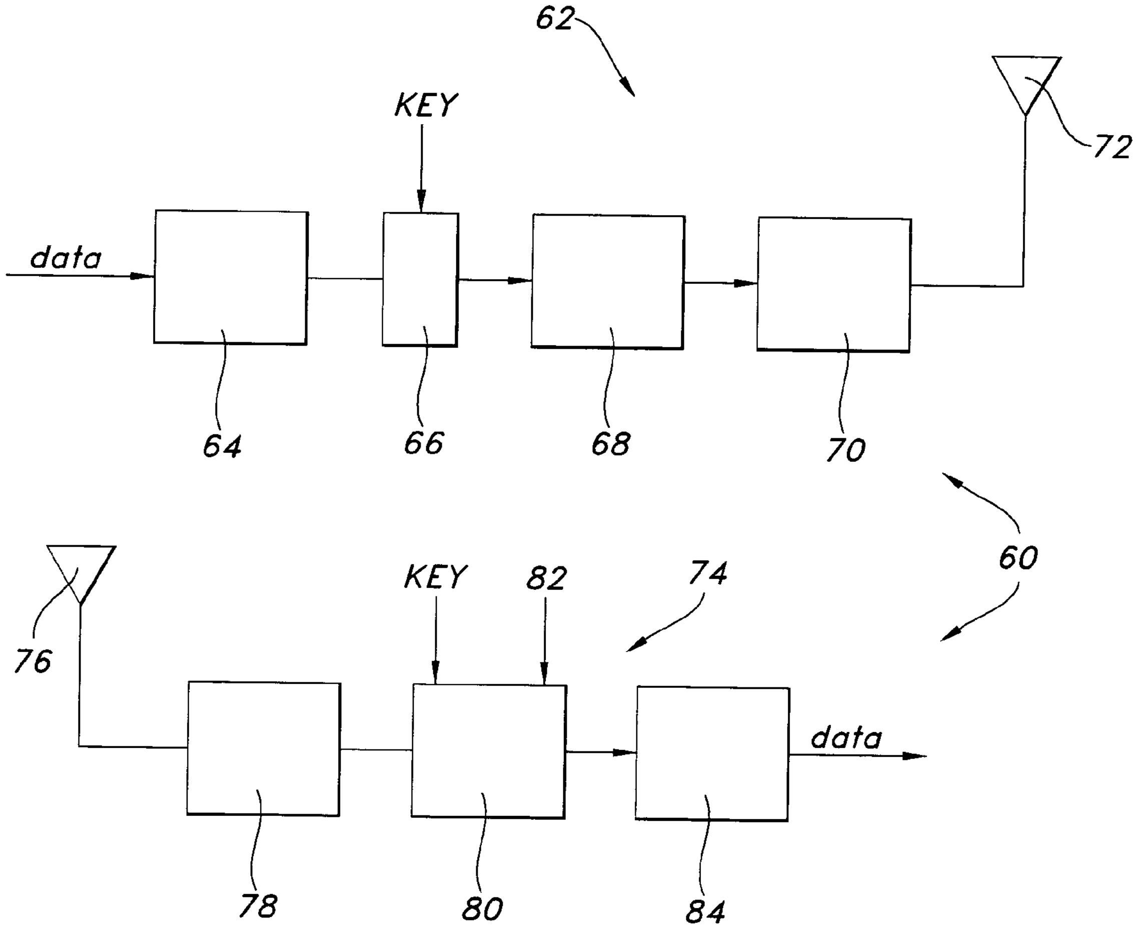
FIG. 8 is a schematic diagram of a transmitter and receiver configured to use the invention.
Figure 9:
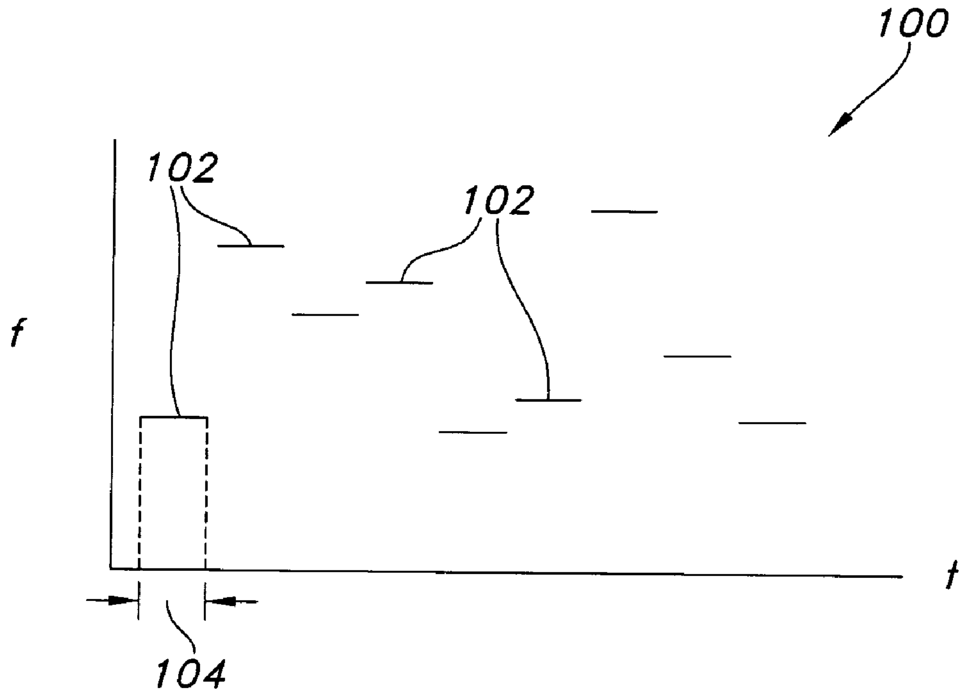
FIG. 9 (PRIOR ART)
FIG. 9 is a graph showing a basic frequency hopping algorithm according to the invention.

A communications system that may be used to implement the invention is shown schematically in FIG. 8 and is indicated generally by reference number 60. System 60 includes a transmitter 62, which in an exemplary embodiment includes a modulator 64 that modulates incoming data according to known techniques. Modulator 64 outputs modulated data to a jitter component 66 that imparts a predetermined sequence of frequency variance according to a key that is available to the receiver as well. In a preferred embodiment, the key may be a PRN-based, TRANSEC-type key, but may also be derived from other known types of encryption strategies that enable a transmitter and a receiver to encrypt and decrypt a message according to a predetermined code. Jitter component 66 then provides an output to an exciter/upconverter 68 and a power amplifier 70, which operate according to known principles to prepare a signal for transmission via a transmission interface, which in a wireless system would be an antenna 72.

System 60 also includes a receiver 74, which receives the transmitted signal using a transmission interface such as an antenna 76. The antenna feeds the received signal to a translator 78. A de-jittering component 80 receives the key information and removes the effects of the jitter from the signal. A time alignment signal 82 may also be input to the de-jittering component to compensate for distance-based or processor-based delays. The de-jittered signal is fed to a demodulator 84, which demodulates the data such that the data is ready for further processing as needed. It should be emphasized that system 60 is only an example of a communications system in which the invention may be used. Various other components may be included with system 60, and the jittering/de-jittering functions may be integrated into the disclosed components, such as the modulator, demodulator, the exciter/upconverter, or alternatively may be performed by additional components. Furthermore, the system may also use wired or optical media instead of the disclosed wireless system. In such systems an appropriate transmission interface would be used.

An advantage of the invention is that it minimizes the detectability of a signal, such as a GMSK, MSK, or other constant envelope-type signal, by hiding or masking the presence of harmonic frequencies normally detectable in said signal when subjected to a non-linear operation (such as a squaring or cubing operation).

Another advantage of the invention is that, when compared to other jittering algorithms (e.g., random walk), a signal modulated according to the invention maintains a frequency profile comparable to an un-jittered signal in terms of predictability, density, and spectral containment.

Still another advantage of the invention is that a receiver cannot effectively determine the transmission frequency without knowing the order in which the sub-dwell periods have been arranged. It is therefore extremely difficult for an unauthorized receiver to intercept and decode the transmitted message.

While the invention has been disclosed in its preferred form, the specific embodiments thereof as disclosed and illustrated herein are not to be considered in a limiting sense as numerous variations are possible. The subject matter of the invention includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the invention of the present disclosure.

What is claimed is:

1. A method of minimizing detectability of an electronically communicated message, comprising:

establishing a nominal transmission frequency;

establishing a dwell period;

defining a predetermined frequency modulation pattern about the nominal transmission frequency, the predetermined frequency modulation pattern being suitable to vary the nominal transmission frequency during the dwell period;

dividing the dwell period into a plurality of sub-dwell periods, where each sub-dwell period has a nominal sub-frequency assigned thereto according to the predetermined frequency modulation pattern;

randomly ordering the plurality of sub-dwell periods and the respective assigned nominal sub-frequencies;

transmitting the message according to the random ordering of the nominal sub-frequencies;

for each randomly ordered nominal sub-frequency, varying the nominal sub-frequency during the respective sub-dwell period by one of increasing and decreasing the nominal sub-frequency;

transmitting the message at frequencies by which each randomly ordered nominal sub-frequency has been increased or decreased; and increasing a time that the transmitted frequency transitions, while still transmitting, from one randomly ordered nominal sub-frequency to a next randomly ordered nominal sub-frequency.

2. The method of claim 1, further including applying a band-limiting filter to each randomly ordered nominal sub-frequency.

3. The method of claim 1, wherein the nominal transmission frequency is one of a plurality of frequency hops of a frequency hopping strategy, and wherein the dwell period is an amount of time the frequency hopping algorithm is configured to maintain the one of the plurality of frequency hops.

4. The method of claim 1, wherein the random ordering of the nominal sub-frequencies is performed using a pseudorandom number generator.

5. The method of claim 1, wherein the predetermined frequency modulation pattern is a frequency jitter pattern that Includes at least one of a frequency increase and a frequency decrease during the dwell period.

6. The method of claim 1, wherein the predetermined frequency modulation pattern is a frequency chirp characterized by one of an increase and a decrease in frequency during the dwell period.

7. A method of minimizing detectability of a message transmitted by a frequency hopping algorithm, the method comprising:

establishing a nominal frequency suitable for transmitting the message during a dwell period according to the frequency hopping algorithm;

defining a predetermined frequency modulation pattern about the nominal frequency, the predetermined frequency modulation pattern being suitable to vary the nominal frequency during the dwell period;

dividing the dwell period into a plurality of sub-dwell periods, where each sub-dwell period has a nominal sub-frequency assigned thereto according to the predetermined frequency modulation pattern;

randomly ordering a sequence of the plurality of sub-dwell periods and the respective assigned nominal sub-frequencies during the dwell period;

for each randomly ordered nominal sub-frequency, varying the nominal sub-frequency during the respective sub-well period by one of increasing and decreasing the nominal sub-frequency;

transmitting the message at frequencies by which each randomly ordered nominal sub-frequency has been increased or decreased; and increasing a time that the transmitted frequency transitions from one randomly ordered nominal sub-frequency to a next randomly ordered nominal sub-frequency.

8. The method of claim 7, further including: applying a band-limiting filter to each randomly ordered nominal sub-frequency.

9. The method of claim 7, wherein the random ordering of the nominal sub-frequencies and the respective nominal sub-frequencies is performed using a pseudorandom number generator.

10. The method of claim 7, wherein the predetermined frequency modulation pattern is a frequency jitter pattern characterized by at least one of a frequency increase and a frequency decrease during the dwell period.

11. The method of claim 7, wherein the predetermined frequency modulation pattern is a frequency chirp characterized by one of an increase in frequency and a decrease in frequency during the dwell period.

12. A method of electronically transmitting a message, comprising:

establishing a nominal transmission frequency;

establishing a dwell period;

defining a predetermined frequency modulation patter about the nominal transmission frequency, the predetermined frequency modulation pattern being suitable to vary the nominal transmission frequency during the dwell period;

dividing the dwell period into a plurality of sub-dwell periods, where each sub-dwell period has a nominal sub-frequency assigned thereto according to the predetermined frequency modulation pattern;

randomly ordering a sequence of the plurality of sub-dwell periods and the respective assigned nominal sub-frequencies according to a pseudo-random algorithm;

transmitting the message according to the randomly ordered ordering of the nominal sub-frequencies;

for each randomly ordered nominal sub-frequency, varying the nominal sub-frequency during the respective sub-well period by one of increasing and decreasing the nominal sub-frequency;

transmitting the message at frequencies by which each randomly ordered nominal sub-frequency has been increased or decreased; and increasing a time that the transmitted frequency jumps from one randomly ordered nominal sub-frequency to a next randomly ordered nominal sub-frequency, wherein the increasing is accomplished by applying a band-limiting filter to the transmitted frequency.

13. The method of claim 12, wherein the nominal transmission frequency is one of a plurality of frequency hops of a frequency hopping strategy, and wherein the dwell period is an amount of time the frequency hopping algorithm is configured to maintain the one of the plurality of frequency hops.

14. The method of claim 12, wherein the predetermined frequency modulation pattern is a frequency chirp characterized by one of an increase in frequency and a decrease in frequency during the dwell period.

* * * * *